(12) United States Patent
Farhat et al.

(10) Patent No.: US 7,843,232 B2
(45) Date of Patent: Nov. 30, 2010

(54) DUAL MODE, SINGLE ENDED TO FULLY DIFFERENTIAL CONVERTER STRUCTURE

(75) Inventors: Bilal Farhat, Aix-en-Provence (FR); Renaud Dura, Aix-en-Provence (FR); Daniel Payrard, St. Maximin (FR)

(73) Assignee: ATMEL Corporation, San Jose, CA (US)

( * ) Notice: Subject to any disclaimer, the term of this patent is extended or adjusted under 35 U.S.C. 154(b) by 0 days.

(21) Appl. No.: 12/395,518

(22) Filed: Feb. 27, 2009

(65) Prior Publication Data

US 2010/0219864 A1    Sep. 2, 2010

(51) Int. Cl.
*G11C 27/02* (2006.01)

(52) U.S. Cl. .............................. 327/91; 327/94; 327/95; 327/337

(58) Field of Classification Search ................... 327/91, 327/94, 95, 337
See application file for complete search history.

(56) References Cited

U.S. PATENT DOCUMENTS

| | | | |
|---|---|---|---|
| 4,988,900 A | 1/1991 | Fensch | |
| 5,220,286 A | 6/1993 | Nadeem | |
| 5,392,043 A * | 2/1995 | Ribner | 341/143 |
| 5,495,200 A * | 2/1996 | Kwan et al. | 327/553 |
| 6,008,749 A | 12/1999 | Smith | |
| 6,040,793 A * | 3/2000 | Ferguson et al. | 341/143 |
| 6,147,522 A * | 11/2000 | Rhode et al. | 327/93 |
| 6,169,427 B1 | 1/2001 | Brandt | |
| 6,204,787 B1 * | 3/2001 | Baird | 341/139 |
| 6,437,720 B1 * | 8/2002 | Yin et al. | 341/150 |
| 6,617,908 B1 * | 9/2003 | Thomsen et al. | 327/337 |
| 6,909,393 B2 | 6/2005 | Atriss et al. | |
| 7,049,860 B2 * | 5/2006 | Gupta | 327/92 |
| 7,068,198 B2 * | 6/2006 | Hong et al. | 341/143 |
| 7,088,147 B2 * | 8/2006 | Prasad et al. | 327/91 |
| 7,102,558 B2 * | 9/2006 | Deval | 341/150 |
| 7,161,520 B2 * | 1/2007 | Liu et al. | 341/155 |
| 7,333,039 B2 | 2/2008 | Lu et al. | |
| 7,397,287 B2 | 7/2008 | Makihara | |
| 7,477,079 B2 * | 1/2009 | Gaboriau et al. | 327/94 |

\* cited by examiner

*Primary Examiner*—Kenneth B. Wells
(74) *Attorney, Agent, or Firm*—Fish & Richardson P.C.

(57) ABSTRACT

A dual mode, single ended to fully differential converter structure is incorporated into a fully differential sample and hold structure which can be coupled with an ADC as a front end for mixed mode applications. The structure incorporates additional switches which allow negative and positive charges to be sampled on both negative and positive sides of the structure. By inverting the sampled charge on one side, single ended to fully differential conversion is obtained. The structure can be implemented in a compact, generic block which performs single ended to fully differential conversions as well as sample and hold functions, without compromising speed and accuracy in either mode.

3 Claims, 9 Drawing Sheets

Sampling Phase

Transferring Phase

Sampling Phase
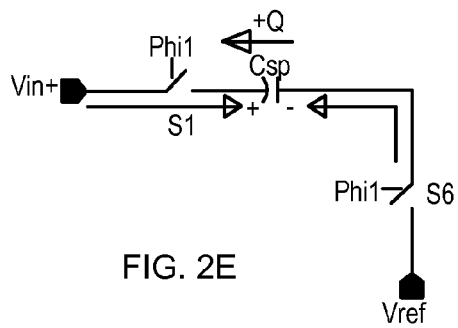
FIG. 2E
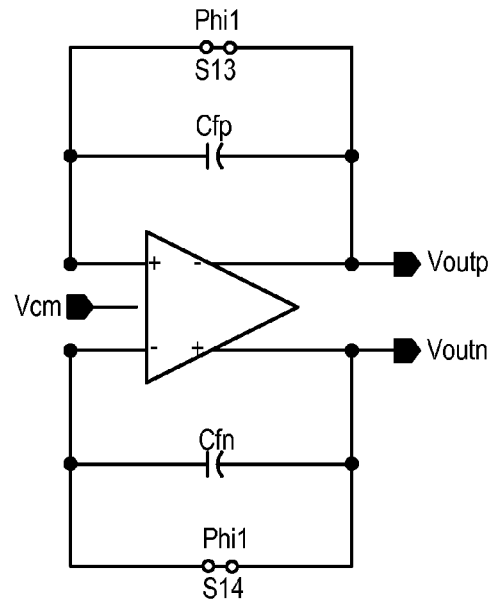
FIG. 2F
FIG. 2G
Transferring Phase
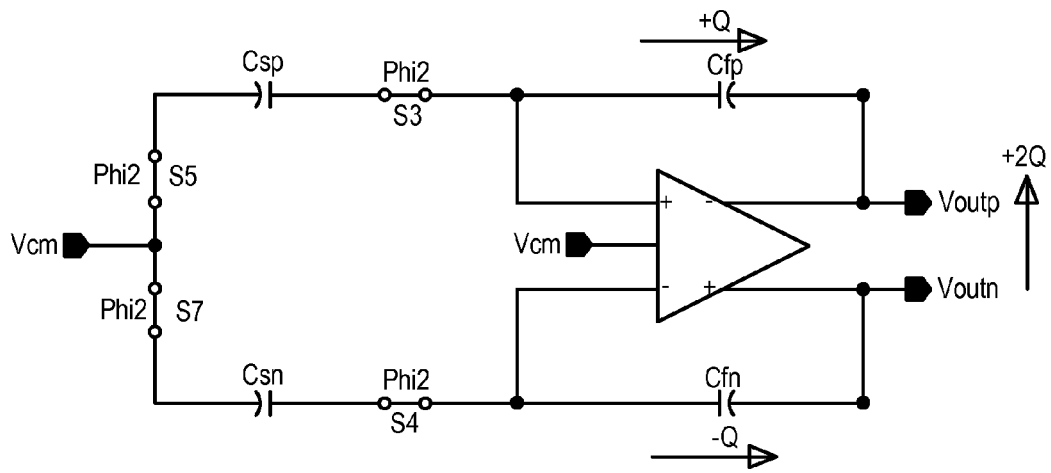
FIG. 2H

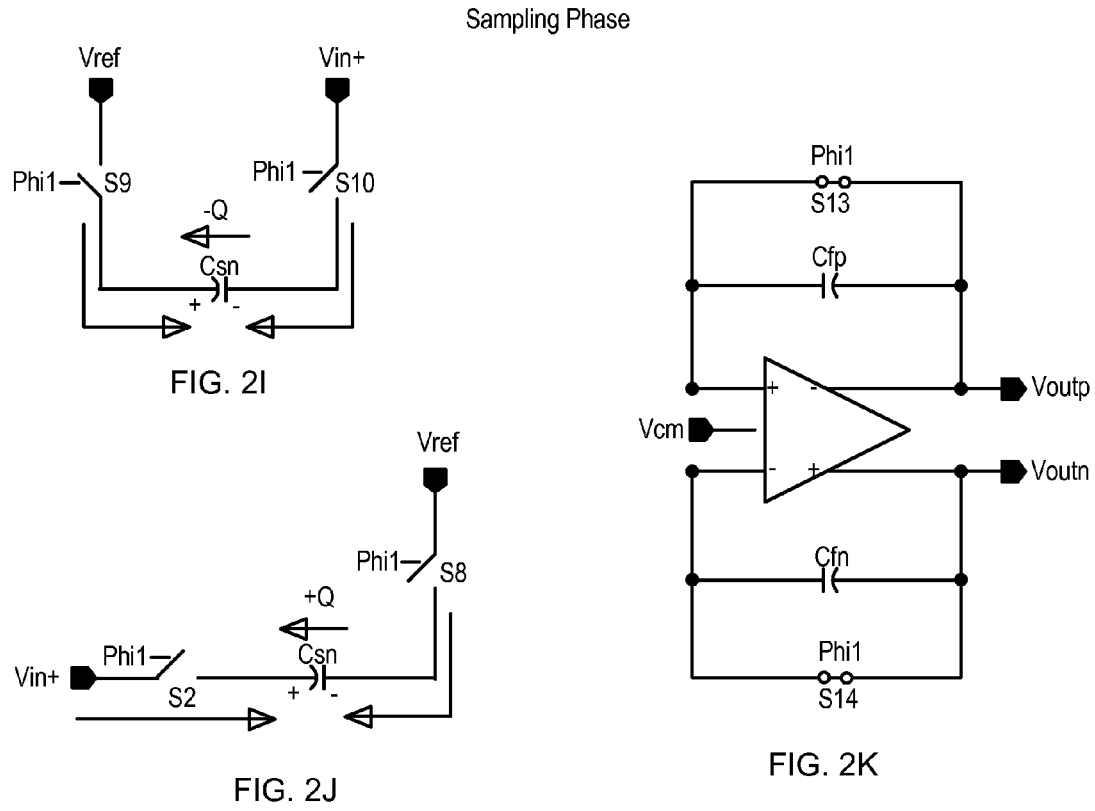
FIG. 2I
FIG. 2J
FIG. 2K
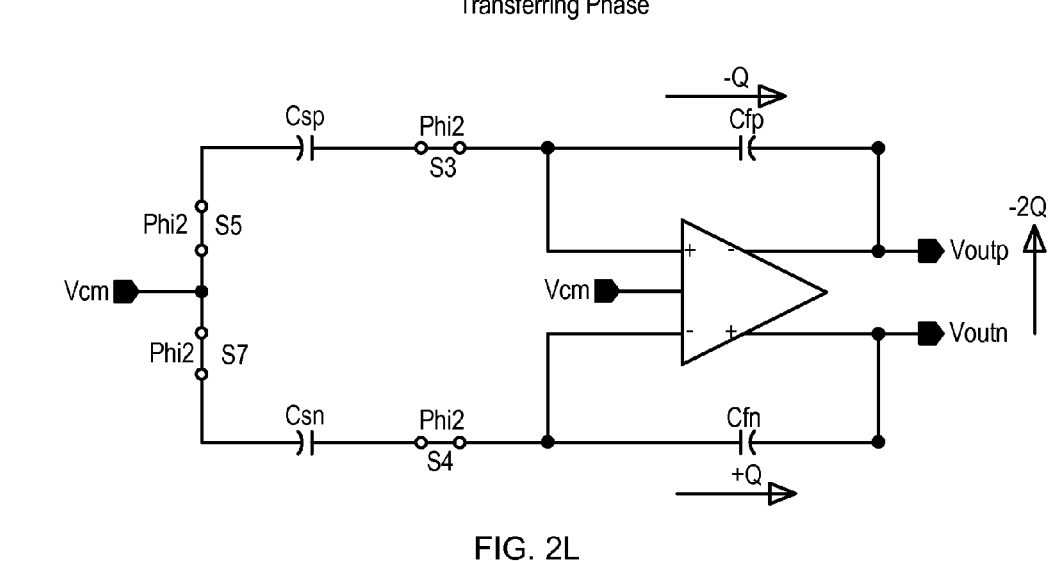
FIG. 2L

DUAL MODE, SINGLE ENDED TO FULLY DIFFERENTIAL CONVERTER STRUCTURE

TECHNICAL FIELD

This subject matter relates generally to electronics, and more particularly to single ended to fully differential conversion structures.

BACKGROUND

High-performance analog circuits are usually implemented in discrete-time circuits, often as switched capacitor (SC) circuits. In a typical circuit architecture, switched capacitors are often integrated because of their small area and high speed. Inherent errors of the capacitors and switches, however, can limit the linearity performance of such circuits. Generally incorporated with an analog-to-digital converter (ADC), these structures can achieve high resolution conversion for low frequency signals, such as Sigma Delta converters.

The inherent errors in conventional SC structures are mainly due to three reasons: charge injection, non-linearity of CMOS switches and capacitor mismatching. Therefore, a tradeoff is often made with respect to speed, accuracy, power consumption and design flexibility. In addition, noise contribution from power supplies should be minimized. Since fully differential circuits have a high common mode rejection, noise contribution from power supplies is an issue for single-ended structures. Nevertheless, fully differential structures require fully differential amplifiers with common mode feedback circuitry to center the output signals around the common mode level of the system. This part of the structure can be challenging to design for high-speed discrete-time operations.

One design technique used to perform single ended to fully differential conversion is the charge and transfer technique (also called charge-redistribution). In charge and transfer designs, analog input voltages are sampled into sampling capacitors in a first phase, then transferred to integration capacitors in a second phase. In a third phase, the integration capacitors are discharged (reset), thus ready to hold the next sampled charges. This design can operate as a simple sample and hold circuit and as an integrator if the feedback capacitors are not reset in each phase. This property is used in oversampling ADCs such as Sigma Delta converters which perform noise shaping to achieve high resolution conversions.

There exist conventional circuits which are capable of providing single ended to fully differential conversions. Some of these conventional circuits require high oversampling which limits the input bandwidth. Other conventional circuits only use positive input and shunt negative input to ground. Therefore, noise immunity (kT/C) and capacitor matching accuracy can differ from one mode to the other.

Other conventional circuits use only the one capacitor (or one branch of the sampling structure) to sample the input, thus, KT/C is double. Moreover, the transfer function for single ended conversion is different than the transfer function for fully differential conversion.

SUMMARY

A dual mode (sample and hold mode and integrator mode), single ended to fully differential converter structure is incorporated into a fully differential sample and hold structure which can be coupled with an ADC as a front end for mixed mode applications. The structure incorporates additional switches (e.g., CMOS switches) which allow negative and positive charges to be sampled on both negative and positive sides of the structure. By inverting the sampled charge on one side, single ended to fully differential conversion is obtained. The structure can be implemented in a compact, generic block which performs single ended to fully differential conversions as well as sample and hold functions, without compromising speed and accuracy in either mode. The structure is fully symmetrical in that the positive side and the negative side of the structure has the same number and types of circuit devices. In single ended conversion, the single ended input signal can be applied into Vin+ or Vin− terminals. Both the positive and negative branches of the structure can transform a positive input sample into a negative output (+Q to −Q).

The dual mode conversion is advantageous because the transfer function of the structure remains the same in both conversion and sample and hold modes. Positive and negative branches of the structure are functional in both modes (i.e., both input capacitors are used for sampling), which provides identical capacitor matching and gain scaling (Cs/CF ratio), resulting in improved distortion (THD). The structure can receive a single ended input signal and provide an output signal balanced about the common mode level of a fully differential circuit. Unlike conventional solutions, the structure does not have a limited input data rate because the same differential voltage is sampled into both sampling capacitors (sampling capacitors on each side or branch) without introducing time delay between two successive samples.

The structure can be incorporated into a variety of clock pulsed, mixed mode systems which need analog input signal adaptation. For example, the disclosed structure can be implemented as a front end of a high data rate pipeline ADC.

BRIEF DESCRIPTION OF THE DRAWINGS

FIGS. 2E-2G are schematic diagrams of the structure of FIG. 2A operating in a sampling phase in single-ended to differential conversion.

FIG. 2H is a schematic diagram of the structure of FIG. 2A operating in a transferring phase in single-ended to differential conversion.

FIGS. 2I-2K are schematic diagrams of the structure of FIG. 2A operating in a sampling phase in single-ended to differential conversion.

FIG. 2L is a schematic diagram of the structure of FIG. 2A operating in a transferring phase in single-ended to differential inverted conversion.

DETAILED DESCRIPTION

Example Sample & Hold Circuit

Figure 1A:
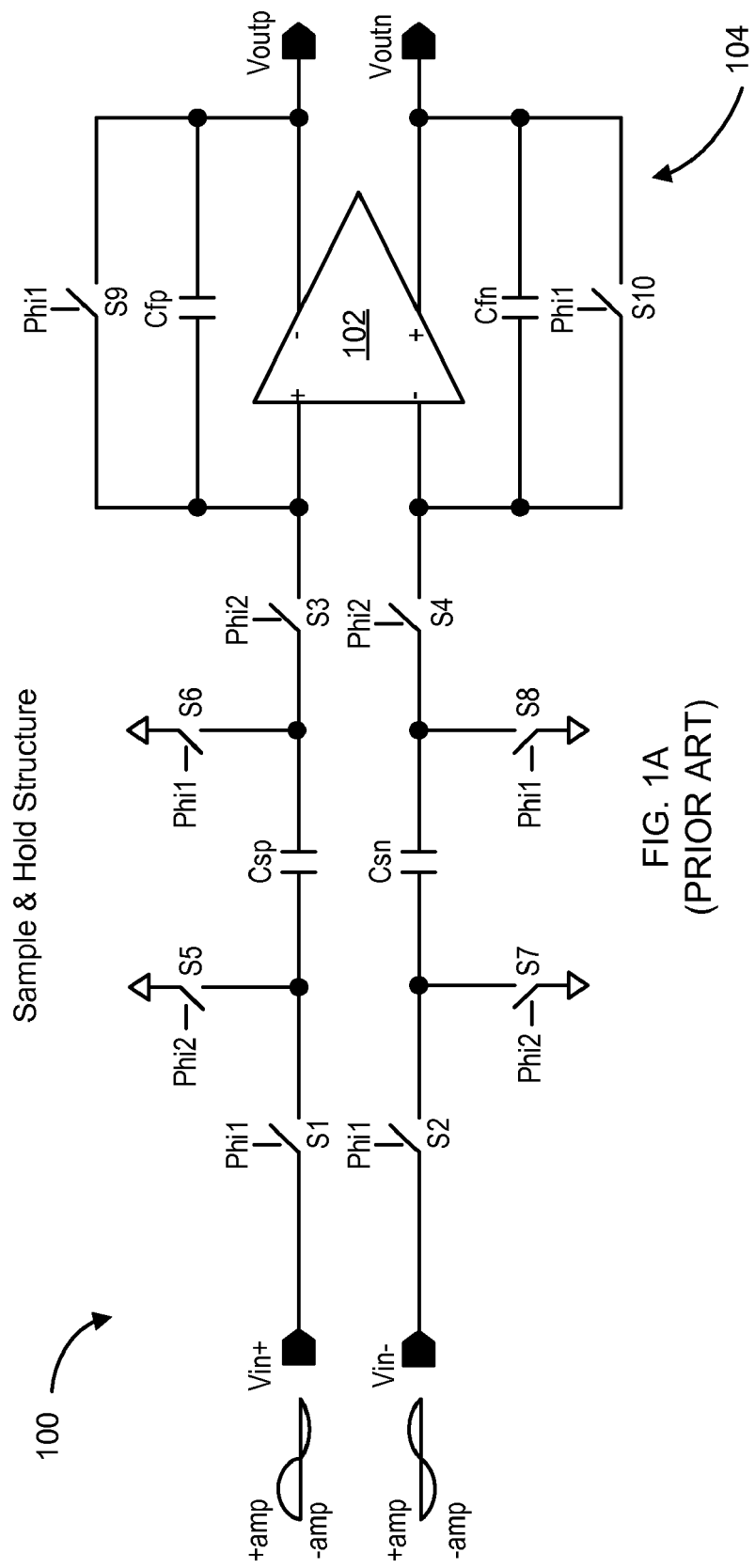
FIG. 1A is a schematic diagram of a fully differential integrator structure for performing sample and hold operations.

FIG. 1A is a schematic diagram of a fully differential integrator structure 100 for performing sample and hold operations. The fully differential structure is inherently immune to power supply noise and can achieve a high common mode rejection ratio. The fully differential structure includes a high gain, fully differential amplifier 102. The high gain, fully differential amplifier 102 is coupled to common mode feedback circuitry 104 to maintain a common mode level of output of the differential amplifier 102 at a predetermined level. Structures using common mode feedback circuitry require that the input differential signal be such that the signal applied to the negative input terminal is the same as the signal applied to the positive terminal but inverted. For example, if the input signal, $V_{diff}$, is a sine wave, then the first half of the sine wave cycle is positive as applied to the first input terminal, the second input terminal should have a sine wave applied thereto with its first half being negative, as shown in FIG. 1A. Accordingly, the common mode voltage, V, can be written as a function of the input signals applied to the positive and negative terminals:

$$V_{IN} = V_{IN+} - V_{IN-} \quad (1)$$

$$V_{IN+} = V_{cm} + \frac{V_{diff}}{2}$$

$$V_{IN-} = V_{cm} - \frac{V_{diff}}{2}, \text{ such that}$$

$$V_{diff} = V_{IN} = V_{IN+} - V_{IN-}, \text{ and}$$

$$V_{cm} = (V_{IN+} + V_{in-})/2.$$

In some implementations, the fully differential integrator structure 100 includes switches S1-S10 (e.g., CMOS switches), sampling capacitors $C_{sp}$, $C_{sn}$ (collectively, referred to as sampling capacitors $C_s$) for positive and negative sides, respectively, of the block 100, differential amplifier 102 and feedback capacitors $C_{fp}$, $C_{fn}$ (collectively, referred to as feedback capacitors $C_f$).

Figure 1B:
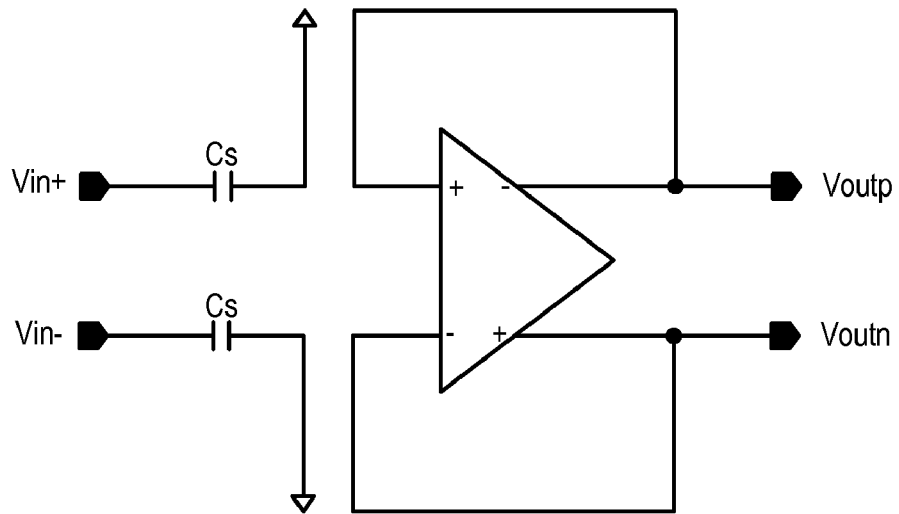
FIG. 1B is a schematic diagram illustrating operation of the structure of FIG. 1A in a sampling phase.
Figure 1C:
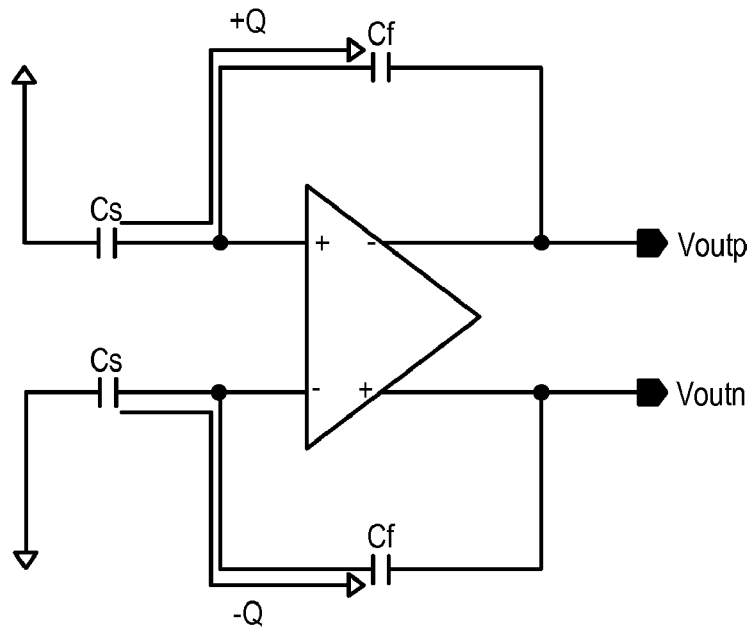
FIG. 1C is a schematic diagram illustrating operation of the structure FIG. 1A in a transferring phase (hold phase).
Figure 1D:
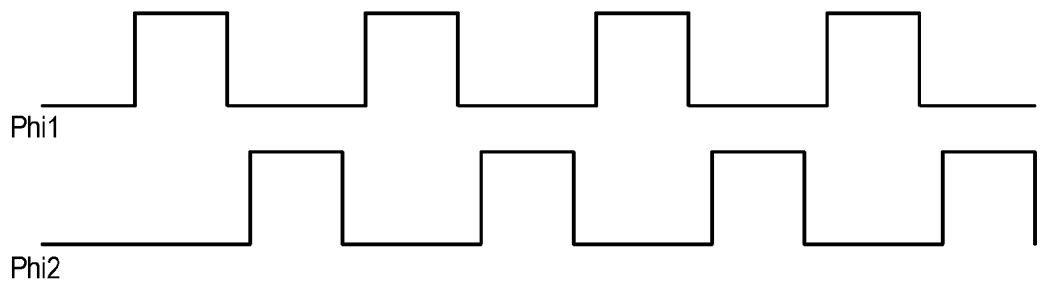
FIG. 1D illustrates non-overlapping waveforms for triggering sampling and transferring phases.

Referring to FIGS. 1B and 1D, in a sampling phase, when phase 1 (Phi1) is high, switches S1, S2, S6 and S8 are closed and inputs $V_{inp}$ and $V_{inn}$ are sampled across sampling capacitors $C_{sp}$, $C_{sn}$. Inputs and outputs of the fully differential amplifier 102 are shorted to reset feedback capacitors, $C_f$, to operate as a sample and hold.

In a transferring phase (hold phase), when phase 2 (Phi1) is high, S3, S4, S5 and S7 are closed and the sampled inputs in capacitors, $C_s$, are transferred across feedback capacitors $C_f$. As shown in FIG. 1C, the inputs and outputs of the fully differential amplifier 102 are coupled together through the feedback capacitors, $C_f$. Positive charges +Q are transferred from the sampling capacitors, $C_s$, to the feedback capacitors $C_f$. The Z transform of the system function is given by:

$$H(Z) = \frac{V_{outdiff}(z)}{V_{indiff}(z)} = 2\frac{C_s}{C_f}\frac{z^{-1}}{(1-z^{-1})}. \quad (2)$$

Figure 1E:
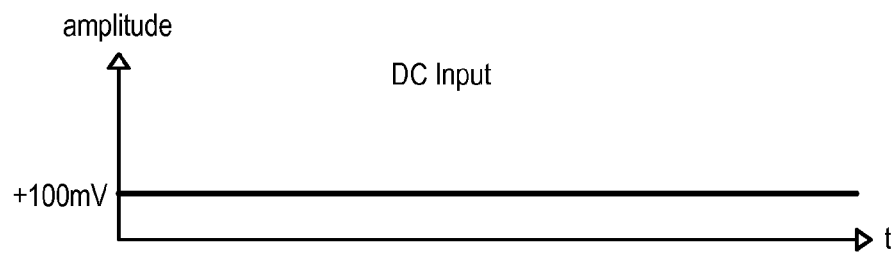
FIGS. 1E-1G illustrate input voltages and output voltages when the structure of FIG. 1A operates either as a sample and hold or as an integrator.
Figure 1F:
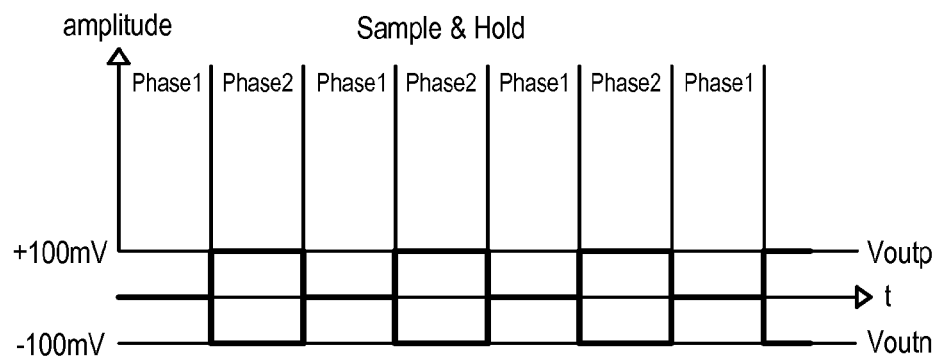
Figure 1G:
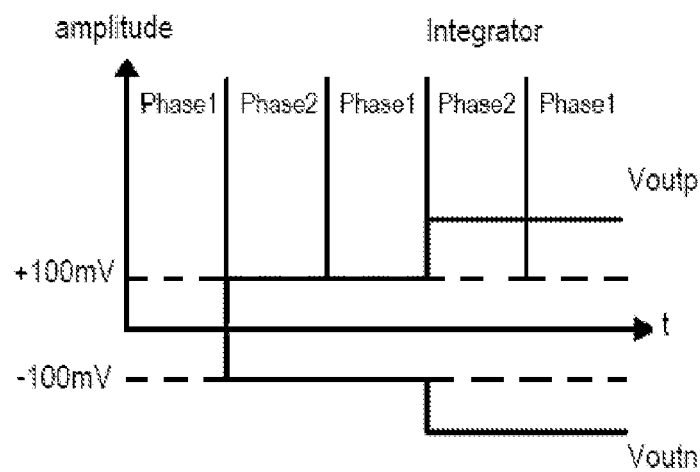

The structure 100 can either operate as a sample and hold or as an integrator. For example, assuming that the input is a DC level voltage with amplitude of 100 mV (FIG. 1E), the output of the structure 100 when operating as a sample and hold and as an integrator are shown in FIGS. 1F and 1G, respectively.

Dual Mode, Single Ended to Fully Differential Converter

Figure 2A:
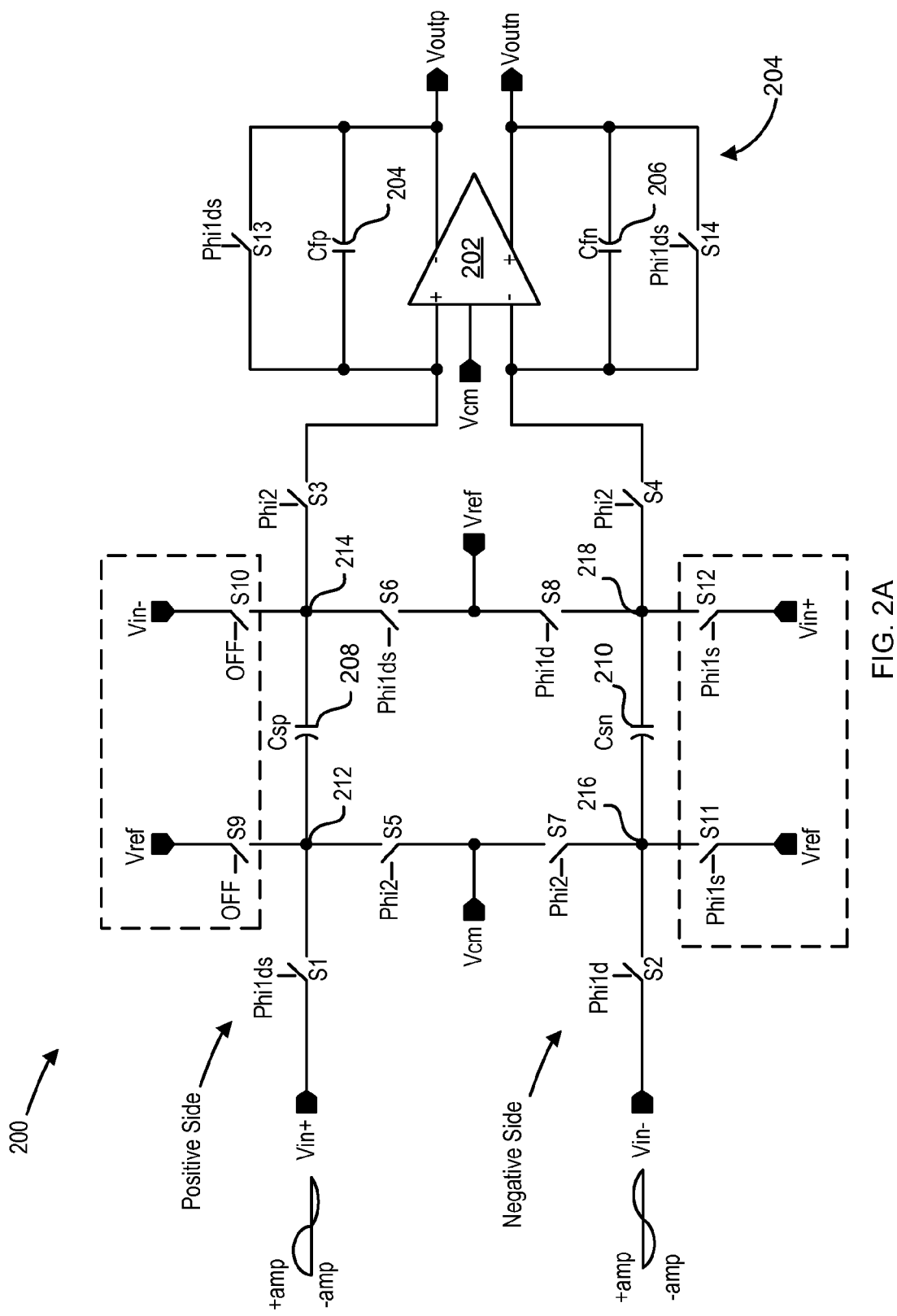
FIG. 2A is a schematic diagram of an example dual mode, single ended to fully differential converter structure.

FIG. 2A is a schematic diagram of an example dual mode, single ended to fully differential converter structure 200. The structure 200 is similar to the structure 100 in FIG. 1A. The structure 200, however, includes four additional switches (S9, S10, S11, S12). By having both positive and negative inputs applied on each sampling capacitor, $C_{sp}$, $C_{sn}$, positive and negative charges +Q and −Q can be sampled on both (positive and negative) sides of the structure 200. By inverting the sampled charge on one side, the structure 200 can provide single ended to fully differential conversion. Note that Phi1$ds$ is equivalent to Phi1 in both fully differential mode and single ended mode, Phi1$d$ is equivalent to Phi1 in fully differential mode only, Phi1$s$ is equivalent to Phi1 in single ended mode only, and OFF is always open (placed for symmetry reasons).

In some implementations, differential amplifier 202 has a positive input terminal, a negative input terminal, a positive output terminal and a negative output terminal. The negative output terminal is coupled to the positive input terminal through feedback capacitor 204. The positive input terminal and negative output terminal of the differential amplifier 202 are coupled to bypass switch S13 which is operable for bypassing feedback capacitor 204 during a sampling phase (Phi1). The positive output terminal of the differential amplifier 202 is coupled to the negative input terminal of the differential amplifier 202 through feedback capacitor 206. The negative input terminal and positive output terminal are coupled to bypass switch S14 which is operable for bypassing feedback capacitor 206 during the sampling phase.

Referring to a positive side or branch of the converter structure 200, a first node 212 is coupled to a positive input terminal of the converter structure 200, switch S1, switch S9, switch S5, and sampling capacitor 208. Switch S1 is operable for coupling the positive input terminal of the converter structure 200 to the first node 212 during the sampling phase. Switch S9 is operable for coupling a reference voltage ($V_{ref}$) to the first node 212 during the sampling phase. Switch S5 is operable for coupling a common mode voltage ($V_{cm}$) to the first node 212 during a transfer phase (Phi2), which occurs after the sampling phase.

A second node 214 is coupled to sampling capacitor 208, switch S3, switch S10 and switch S6. Switch S3 is operable for coupling the positive input terminal of the differential amplifier 202 to the second node 214 during the transferring phase. Switch S6 is operable for coupling the reference voltage to the second node 214 during the sampling phase. Switch S10 is operable for coupling the negative input terminal of the converter structure 200 (Vin−) to the second node 214 during the sampling phase.

Referring to a negative side or branch of the converter structure 200, a third node 216 is coupled to a negative input terminal of the converter structure 200, switch S2, switch S11, switch S7, and sampling capacitor 210. Switch S2 is operable for coupling the negative input terminal of the converter structure 200 to the third node 216 during the sampling phase. Switch 11 is operable for coupling the reference voltage to the third node 216 during the sampling phase. Switch S7 is operable for coupling the common mode voltage to the third node 216 during the transferring phase.

A fourth node 218 is coupled to sampling capacitor 210, switch S4, switch S12, switch S8, and the negative input terminal of the differential amplifier 202. Switch S4 is operable for coupling the negative input terminal of the differential amplifier 202 to the fourth node 218 during the transferring phase. Switch S8 is operable for coupling the reference voltage to the fourth node 218 during the sampling phase. Switch S12 operable for coupling the positive input terminal of converter structure 200 to the fourth node 218 during the sampling phase.

Fully Differential Conversion Mode

Figure 2B:
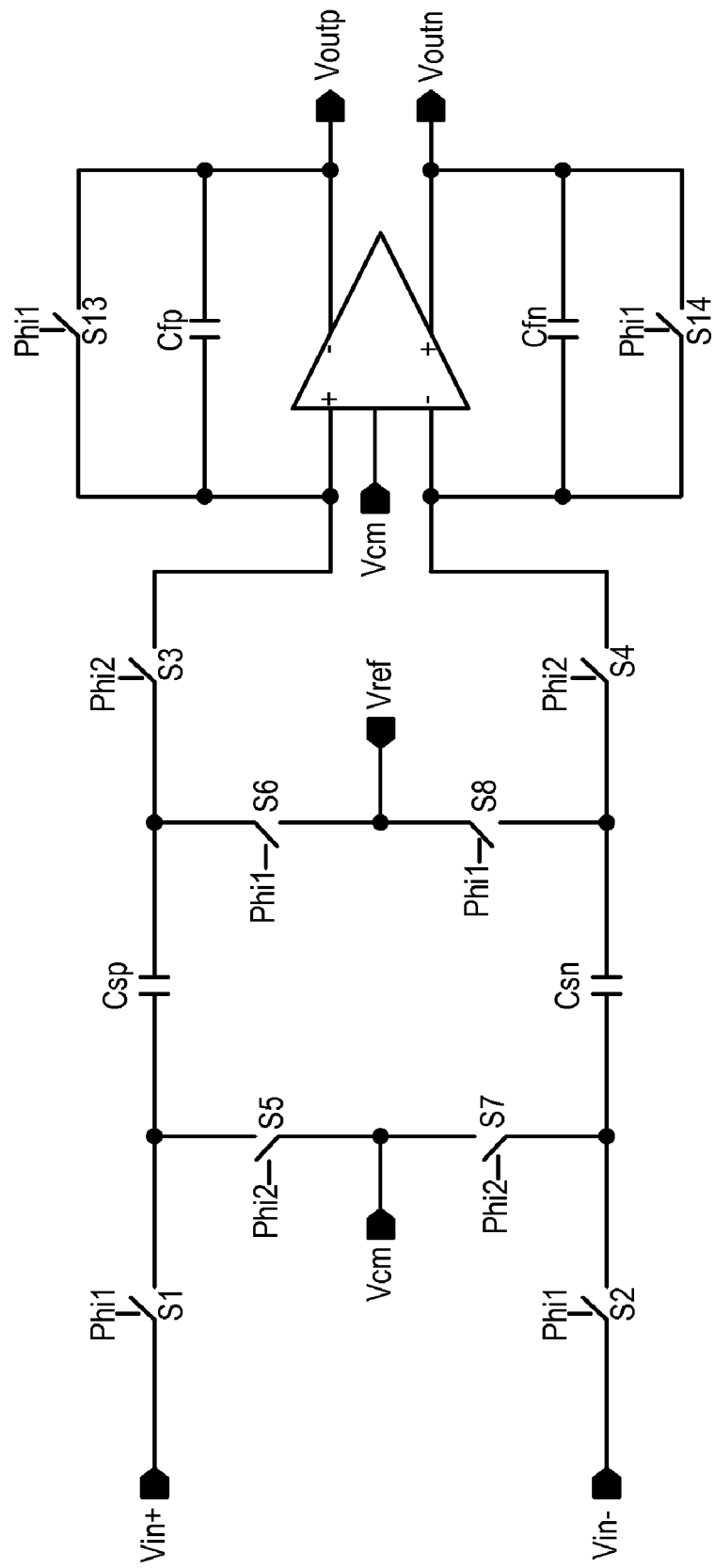
FIG. 2B is a schematic diagram of the structure of FIG. 2A operating in fully differential conversion mode.

FIG. 2B is a schematic diagram of the structure 200 of FIG. 2A operating in fully differential conversion mode. In fully differential conversion mode, switches S9, S10, S11 and S12 are open, resulting in structure 200 being the same as structure 100 shown in FIG. 1A. The structure 100 operates in the same manner as structure 100 to adapt an external input signal into a sampled system.

Sampling Phase

Figure 2C:
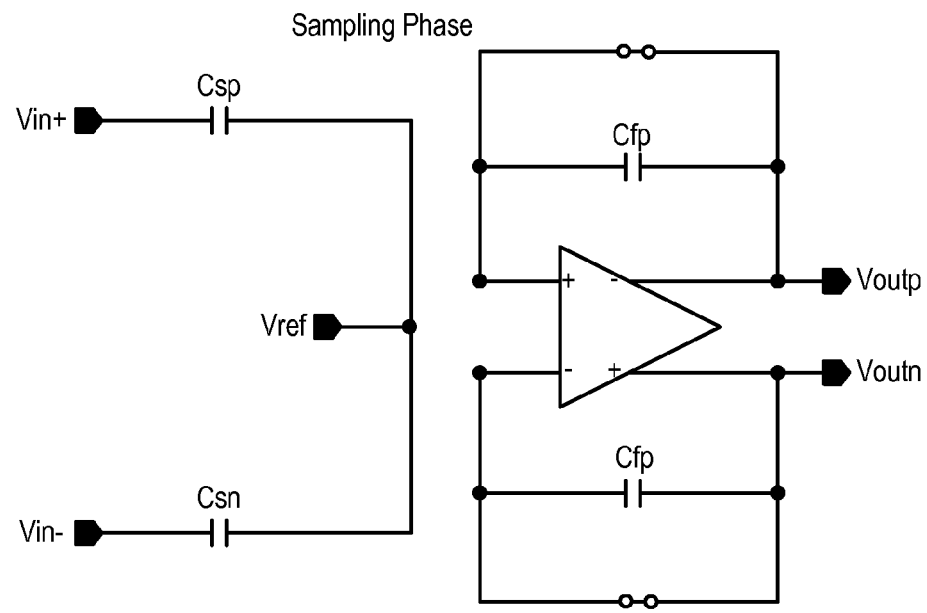
FIG. 2C is a schematic diagram of the structure of FIG. 2A operating in a sampling phase in differential to differential conversion.
Figure 3:
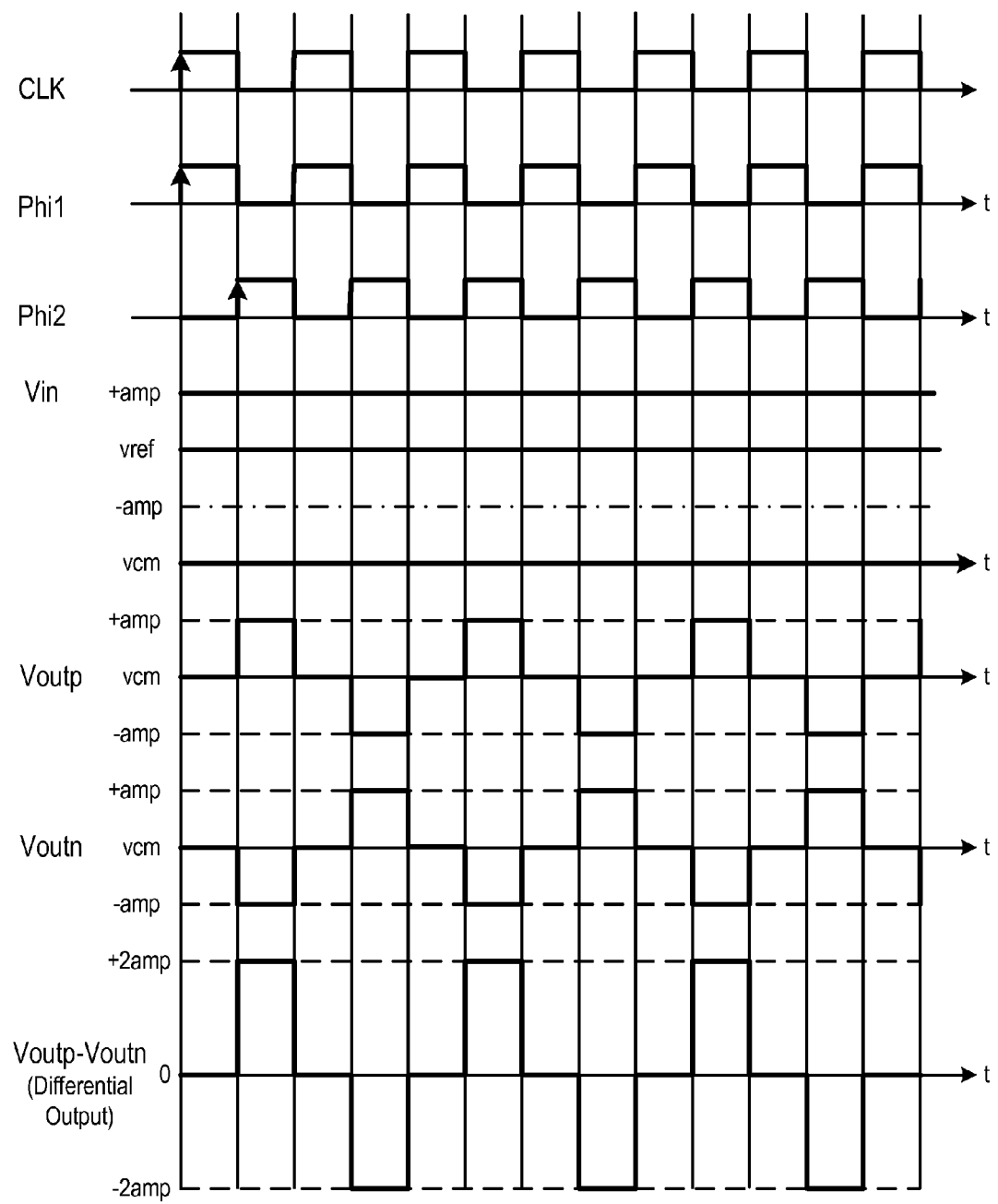
FIG. 3 illustrates input/output waveforms for a sample and hold mode of the structure of FIG. 2A.

FIG. 2C is a schematic diagram of the structure 200 of FIG. 2A operating in a sampling phase. In this example sampling phase, Phi1 is high and Phi1 is low (FIG. 3). Switches S1, S2, S6, S8, S13 and S14 are closed and switches S3, S4, S5, S7, S9, S10, S11 and S12 are open. In sampling phase, both inputs, $V_{in+}$, $V_{in-}$ are sampled into sampling capacitors, $C_s$, by a differential voltage of $\Delta V = V_{in} - V_{ref}$. Reference voltage, $V_{ref}$, can be different from the amplifier common mode voltage, $V_{cm}$. Thus, DC level shifting can be assured.

Transferring Phase

Hold Phase

Figure 2D:
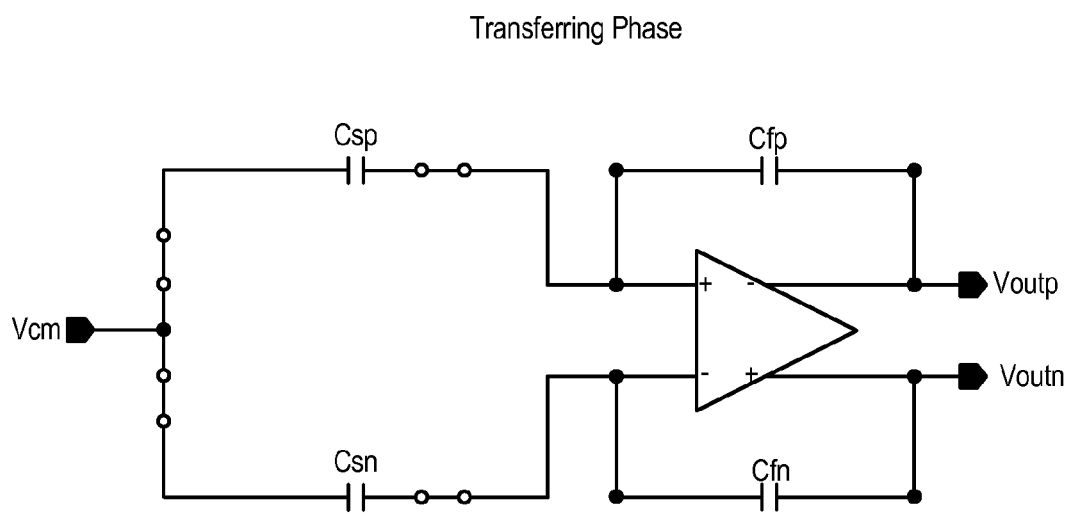
FIG. 2D is a schematic diagram of the structure of FIG. 2A operating in a transferring phase in differential to differential conversion.

FIG. 2D is a schematic diagram of the structure 200 of FIG. 2A operating in a transferring phase (hold phase). In this example transferring phase, Phi1 is low and Phi1 is high (FIG. 3). Switches S3, S4, S5, S7 are closed and switches S1, S2, S9, S10, S11, S12, S13 and S14 are open. In transferring phase, voltage difference $\Delta V$ is transferred from sampling capacitors, $C_s$, to feedback (or holding) capacitors, $C_f$, with a DC level shifting equal to $V_{ref} - V_{cm}$. If $V_{ref} = V_{cm}$, no DC level shifting occurs.

Single Ended To Fully Differential Conversion Mode

FIGS. 2E-2H are schematic diagrams of the structure 200 of FIG. 2A operating in a sampling phase. In single ended to fully differential conversion, the positive side or branch of the structure maintains the same functioning, as shown in FIG. 2E. For example, switches S1, S6, S13 are closed and switches S3, S5, S9 and S10 are open. This results in a positive charge, +Q, being charged into the sampling capacitor, Csp. On the negative side or branch of the structure switches S11, S12, S14 are closed and switches S2 and S8 are open. This configuration results in a negative charge −Q being charged into the sampling capacitor, Csn.

However, the negative branch inverts the sampling charge +Q into −Q by applying $V_{in}$ on the other side of the sampling capacitor $C_{sn}$, as shown in FIG. 2F. FIG. 2G shows the differential amplifier and feedback circuits in sampling phase.

Referring to FIG. 2H, in a transferring phase, two opposite charges +Q and −Q are transferred into feedback capacitors $C_{fp}$ and $C_{fn}$, respectively, resulting in a fully differential output signal with an inherent gain of 2. For example, the differential output voltage is given by $(v_{outp} - v_{outn}) = +Q/C_f - (-Q/C_f) = 2Q/C_f$. As can be seen in FIG. 3, the output signals, $v_{op}$, $v_{on}$, satisfy the requirement of a fully differential signal. The transfer function is given by:

$$H(Z) = \frac{V_{outdiff}(z)}{V_{indiff}(z)} = 2\frac{C_s}{C_f}\frac{z^1}{(1-z^1)}. \quad (3)$$

FIGS. 2I-2K are schematic diagrams of the structure of FIG. 2A operating in a sampling phase. These figures illustrate the structure is fully symmetrical. Not only can the negative branch of the structure transform a positive input sample into a negative output (+Q to −Q), the positive branch of the structure can perform the transform as well, as illustrated in FIGS. 2I-2K.

FIG. 2L is a schematic diagram of the structure of FIG. 2A operating in a transferring phase. In a transferring phase, two opposite charges −Q and +Q are transferred into feedback capacitors $C_{fp}$, and $C_{fn}$, respectively, resulting in a fully differential output signal with an inherent gain of −2. For example, the differential output voltage is given by $v_{outp} - v_{outn} = -Q/C_f - (+Q/C_f) = -2Q/C_f$.

FIG. 3 illustrates input/output waveforms for a sample and hold mode of the structure of FIG. 2A. In a first half of a first CLK cycle, Phi1 is high and Phi2 is low. $V_{in}$ is at +amp (amplitude). $V_{outp}$ and $V_{outn}$ are at and the differential output ($V_{outp} - V_{outn}$) is 0. In a second half of the first CLK cycle, Phi1 is low and Phi2 is high. $V_{in}$ is at +amp. $V_{outp}$ is at +amp and $V_{outn}$ is amp and the differential output (amp+−(−amp)) is 2 amp.

Similarly, in a first half of a second CLK cycle following the firs CLK cycle, Phi1 is high and Phi2 is low. $V_{in}$ is at +amp (amplitude). $V_{outp}$ and $V_{outn}$ are at $V_{cm}$ and the differential output ($V_{outp} - V_{outn}$) is 0. In a second half of the second CLK cycle, Phi1 is low and Phi2 is high. $V_{in}$ is at +amp. $V_{outp}$ is at +amp and $V_{outn}$ is −amp and the differential output (+amp−(−amp)) is +2 amp.

What is claimed is:

1. A dual mode, single ended to fully differential converter structure, comprising:
a differential amplifier having a positive input terminal, a negative input terminal, a positive output terminal and a negative output terminal, the positive output terminal of the differential amplifier coupled to the negative input terminal of the differential amplifier through a first feedback capacitor, the positive input terminal and negative output terminal coupled to a first bypass switch which is operable for bypassing the first feedback capacitor during a sampling phase, the negative output terminal of the differential amplifier coupled to the positive input terminal of the differential amplifier through a second feedback capacitor, the negative input terminal and positive output terminal of the differential amplifier coupled to a second bypass switch which is operable for bypassing the second feedback capacitor during the sampling phase;

a first node coupled to a positive input terminal of the converter structure, a first switch, a second switch, a third switch and to a first terminal of a first sampling capacitor, the first switch operable for coupling the positive input terminal of the converter structure to the first node during the sampling phase, the second switch operable for coupling a reference voltage to the first node during the sampling phase, the third switch operable for coupling a common mode voltage to the first node during a transferring phase which occurs after the sampling phase;

a second node coupled to a second terminal of the first sampling capacitor, a fourth switch, a fifth switch and a sixth switch, the fourth switch operable for coupling the positive input terminal of the differential amplifier to the second node during the transferring phase, the fifth switch operable for coupling the reference voltage to the second node during the sampling phase, the sixth switch operable for coupling a negative input terminal of the converter structure to the second node during the sampling phase;

a third node coupled to the negative input terminal of the converter structure, a seventh switch, an eighth switch, a ninth switch and to a first terminal of a second sampling capacitor, the seventh switch operable for coupling the negative input terminal of the converter structure to the third node during the sampling phase, the eighth switch operable for coupling the reference voltage to the third node during the sampling phase, the ninth switch operable for coupling the common mode voltage to the third node during the transferring phase; and a fourth node coupled to a second terminal of the second sampling capacitor, a tenth switch, a eleventh switch and a twelfth switch, the tenth switch operable for coupling the negative input terminal of the differential amplifier to the fourth node during the transferring phase, the eleventh switch operable for coupling the reference voltage to the fourth node during the sampling phase, the twelfth switch operable for coupling the positive input terminal of the converter structure to the fourth node during the sampling phase.

2. The converter of claim 1, where the switches are CMOS switches.

3. The converter of claim 1, further comprising:
an analog-to-digital converter coupled to at least one of the positive and negative outputs of the differential amplifier.

\* \* \* \* \*